(12) United States Patent
Ibars Casas et al.

(10) Patent No.: US 11,310,000 B2
(45) Date of Patent: Apr. 19, 2022

(54) TRANSPORT BLOCK SEGMENTATION FOR MULTI-LEVEL CODES

(71) Applicant: Cohere Technologies, Inc., Santa Clara, CA (US)

(72) Inventors: Christian Ibars Casas, Santa Clara, CA (US); Shachar Kons, Santa Clara, CA (US); Ronny Hadani, Santa Clara, CA (US)

(73) Assignee: Cohere Technologies, Inc., Santa Clara, CA (US)

( * ) Notice: Subject to any disclaimer, the term of this patent is extended or adjusted under 35 U.S.C. 154(b) by 458 days.

(21) Appl. No.: 16/336,823

(22) PCT Filed: Sep. 29, 2017

(86) PCT No.: PCT/US2017/054517
§ 371 (c)(1),
(2) Date: Mar. 26, 2019

(87) PCT Pub. No.: WO2018/064587
PCT Pub. Date: Apr. 5, 2018

(65) Prior Publication Data
US 2021/0288765 A1    Sep. 16, 2021

Related U.S. Application Data

(60) Provisional application No. 62/401,682, filed on Sep. 29, 2016.

(51) Int. Cl.
*H03M 13/00* (2006.01)
*H04L 1/24* (2006.01)
(Continued)

(52) U.S. Cl.
CPC .......... *H04L 1/246* (2013.01); *H03M 13/251* (2013.01); *H03M 13/255* (2013.01);
(Continued)

(58) Field of Classification Search
CPC ... H04L 1/246; H03M 13/251; H03M 13/255; H03M 13/256; H03M 13/258;
(Continued)

(56) References Cited

U.S. PATENT DOCUMENTS 4,754,493 A    6/1988 Coates
5,083,135 A    1/1992 Nagy et al.
(Continued)

FOREIGN PATENT DOCUMENTS

CN    1235720 A    11/1999
CN    101682316 A    3/2010
(Continued)

OTHER PUBLICATIONS

Office Action for U.S. Appl. No. 13/117,119, dated Aug. 5, 2013, 5 pages.
(Continued)

*Primary Examiner* — Christine T. Tu
(74) *Attorney, Agent, or Firm* — Perkins Coie LLP

(57) ABSTRACT

A wireless communication method for transmitting wireless signals from a transmitter includes dividing bits of the transport block into a number of code blocks, wherein each code block corresponds to a bit-level of a multi-level modulation scheme used for transmission, and wherein a size of each code block is inversely proportional to a corresponding coding rate used for coding the code block.

20 Claims, 7 Drawing Sheets

(51) Int. Cl.
    *H03M 13/25* (2006.01)
    *H03M 13/27* (2006.01)
    *H03M 13/29* (2006.01)
(52) U.S. Cl.
    CPC ....... *H03M 13/256* (2013.01); *H03M 13/258* (2013.01); *H03M 13/27* (2013.01); *H03M 13/29* (2013.01); *H03M 13/6516* (2013.01)
(58) Field of Classification Search
    CPC .. H03M 13/27; H03M 13/29; H03M 13/6516; H03M 13/2707
    USPC ................ 714/701, 746, 752, 774, 799, 726
    See application file for complete search history.

(56) References Cited

U.S. PATENT DOCUMENTS

| | | |
|---|---|---|
| 5,182,642 A | 1/1993 | Gersdorff et al. |
| 5,623,511 A | 4/1997 | Bar-David et al. |
| 5,831,977 A | 11/1998 | Dent |
| 5,872,542 A | 2/1999 | Simons et al. |
| 5,956,624 A | 9/1999 | Hunsinger et al. |
| 6,212,246 B1 | 4/2001 | Hendrickson |
| 6,289,063 B1 | 9/2001 | Duxbury |
| 6,356,555 B1 | 3/2002 | Rakib et al. |
| 6,388,621 B1 | 5/2002 | Lynch |
| 6,426,983 B1 | 7/2002 | Rakib et al. |
| 6,608,864 B1 | 8/2003 | Strait |
| 6,631,168 B2 | 10/2003 | Izumi |
| 6,704,366 B1 | 3/2004 | Combes et al. |
| 6,956,814 B1 | 10/2005 | Campanella |
| 7,010,048 B1 | 3/2006 | Shattil |
| 7,327,812 B2 | 2/2008 | Auer |
| 7,392,018 B1 | 6/2008 | Ebert et al. |
| 7,689,049 B2 | 3/2010 | Monro |
| 7,773,685 B2 | 8/2010 | Tirkkonen et al. |
| 7,864,877 B2 | 1/2011 | Hottinen |
| 8,229,017 B1 | 7/2012 | Lee et al. |
| 8,259,845 B2 * | 9/2012 | Dent .................. H04L 25/0384 375/296 |
| 8,401,131 B2 | 3/2013 | Fety et al. |
| 8,547,988 B2 | 10/2013 | Hadani et al. |
| 8,619,892 B2 | 12/2013 | Vetter et al. |
| 8,630,363 B2 * | 1/2014 | Seyedi-Esfahani .......................... H04L 25/03203 375/264 |
| 8,717,210 B2 | 5/2014 | Eldar et al. |
| 8,879,378 B2 | 11/2014 | Rakib et al. |
| 8,892,048 B1 | 11/2014 | Turner |
| 8,976,851 B2 | 3/2015 | Hadani et al. |
| 9,031,141 B2 | 5/2015 | Hadani et al. |
| 9,071,285 B2 | 6/2015 | Hadani et al. |
| 9,071,286 B2 | 6/2015 | Hadani et al. |
| 9,083,483 B1 | 7/2015 | Rakib et al. |
| 9,083,595 B2 | 7/2015 | Rakib et al. |
| 9,130,638 B2 | 9/2015 | Hadani et al. |
| 9,282,528 B2 | 3/2016 | Hashimoto |
| 9,294,315 B2 | 3/2016 | Hadani et al. |
| 9,444,514 B2 | 9/2016 | Hadani et al. |
| 9,548,840 B2 | 1/2017 | Hadani et al. |
| 9,553,984 B2 | 1/2017 | Krause et al. |
| 9,590,779 B2 | 3/2017 | Hadani et al. |
| 9,634,719 B2 | 4/2017 | Rakib et al. |
| 9,660,851 B2 | 5/2017 | Hadani et al. |
| 9,668,148 B2 | 5/2017 | Hadani et al. |
| 9,712,354 B2 | 7/2017 | Hadani et al. |
| 9,729,281 B2 | 8/2017 | Hadani et al. |
| 2001/0031022 A1 | 10/2001 | Petrus et al. |
| 2001/0033614 A1 | 10/2001 | Hudson |
| 2001/0046205 A1 | 11/2001 | Easton et al. |
| 2002/0001308 A1 | 1/2002 | Heuer |
| 2002/0034191 A1 | 3/2002 | Shattil |
| 2002/0181388 A1 | 12/2002 | Jain et al. |
| 2002/0181390 A1 | 12/2002 | Mody et al. |
| 2002/0181607 A1 | 12/2002 | Izumi |
| 2003/0073464 A1 | 4/2003 | Giannakis et al. |
| 2003/0185295 A1 | 10/2003 | Yousef |
| 2003/0235147 A1 | 12/2003 | Walton et al. |
| 2004/0044715 A1 | 3/2004 | Aldroubi et al. |
| 2004/0174812 A1 | 9/2004 | Murakami et al. |
| 2004/0189581 A1 | 9/2004 | Sako et al. |
| 2004/0218523 A1 | 11/2004 | Varshney et al. |
| 2005/0157778 A1 | 7/2005 | Trachewsky et al. |
| 2005/0157820 A1 | 7/2005 | Wongwirawat et al. |
| 2005/0180517 A1 | 8/2005 | Abe |
| 2005/0207334 A1 | 9/2005 | Hadad |
| 2005/0251844 A1 | 11/2005 | Martone et al. |
| 2006/0008021 A1 | 1/2006 | Bonnet |
| 2006/0039270 A1 | 2/2006 | Strohmer et al. |
| 2007/0014272 A1 | 1/2007 | Palanki et al. |
| 2007/0038691 A1 | 2/2007 | Candes et al. |
| 2007/0078661 A1 | 4/2007 | Sriram et al. |
| 2007/0104283 A1 | 5/2007 | Han et al. |
| 2007/0110131 A1 | 5/2007 | Guess et al. |
| 2007/0211952 A1 | 9/2007 | Faber et al. |
| 2007/0237181 A1 | 10/2007 | Cho et al. |
| 2007/0253465 A1 | 11/2007 | Muharemovic et al. |
| 2007/0253504 A1 | 11/2007 | Hasegawa |
| 2008/0043857 A1 | 2/2008 | Dias et al. |
| 2008/0117999 A1 | 5/2008 | Kadous et al. |
| 2008/0186843 A1 | 8/2008 | Ma et al. |
| 2008/0187062 A1 | 8/2008 | Pan et al. |
| 2008/0232504 A1 | 9/2008 | Ma et al. |
| 2008/0310383 A1 | 12/2008 | Kowalski |
| 2009/0080403 A1 | 3/2009 | Hamdi |
| 2009/0092259 A1 | 4/2009 | Jot et al. |
| 2009/0103593 A1 | 4/2009 | Bergamo |
| 2009/0122854 A1 | 5/2009 | Zhu et al. |
| 2009/0161804 A1 | 6/2009 | Chrabieh et al. |
| 2009/0204627 A1 | 8/2009 | Hadani |
| 2009/0222226 A1 | 9/2009 | Baraniuk et al. |
| 2009/0303961 A1 | 12/2009 | Popovic et al. |
| 2010/0001901 A1 | 1/2010 | Baraniuk et al. |
| 2010/0008432 A1 | 1/2010 | Kim et al. |
| 2010/0027608 A1 | 2/2010 | Priotti |
| 2010/0111138 A1 | 5/2010 | Hosur et al. |
| 2010/0142476 A1 | 6/2010 | Jiang et al. |
| 2010/0187914 A1 | 7/2010 | Rada et al. |
| 2010/0238787 A1 | 9/2010 | Guey |
| 2010/0277308 A1 | 11/2010 | Potkonjak |
| 2010/0303136 A1 | 12/2010 | Ashikhmin et al. |
| 2010/0322349 A1 | 12/2010 | Lee et al. |
| 2011/0007789 A1 | 1/2011 | Garmany |
| 2011/0110532 A1 | 5/2011 | Svendsen |
| 2011/0116489 A1 | 5/2011 | Grandhi |
| 2011/0116516 A1 | 5/2011 | Hwang et al. |
| 2011/0126071 A1 | 5/2011 | Han et al. |
| 2011/0131463 A1 | 6/2011 | Gunnam |
| 2011/0216808 A1 | 9/2011 | Tong et al. |
| 2011/0286502 A1 | 11/2011 | Adachi et al. |
| 2011/0287778 A1 | 11/2011 | Levin et al. |
| 2011/0292971 A1 | 12/2011 | Hadani et al. |
| 2011/0293030 A1 | 12/2011 | Rakib et al. |
| 2011/0299379 A1 | 12/2011 | Sesia et al. |
| 2011/0305267 A1 | 12/2011 | Riu et al. |
| 2012/0021769 A1 | 1/2012 | Lindoff et al. |
| 2012/0051457 A1 | 3/2012 | Ma et al. |
| 2012/0140716 A1 | 6/2012 | Baldemair et al. |
| 2012/0170684 A1 | 7/2012 | Yim et al. |
| 2012/0201322 A1 | 8/2012 | Rakib et al. |
| 2012/0213098 A1 | 8/2012 | Sun |
| 2012/0235795 A1 | 9/2012 | Liao et al. |
| 2012/0269201 A1 | 10/2012 | Atungsiri et al. |
| 2012/0272117 A1 | 10/2012 | Stadelmeier et al. |
| 2012/0320994 A1 | 12/2012 | Loghin et al. |
| 2013/0021977 A1 | 1/2013 | Yang et al. |
| 2013/0058390 A1 | 3/2013 | Haas et al. |
| 2013/0077579 A1 | 3/2013 | Cho et al. |
| 2013/0083661 A1 | 4/2013 | Gupta et al. |
| 2013/0121497 A1 | 5/2013 | Smaragdis et al. |
| 2013/0230010 A1 | 9/2013 | Kim et al. |
| 2013/0260787 A1 | 10/2013 | Hashimoto |
| 2013/0279627 A1 | 10/2013 | Wu et al. |
| 2013/0315133 A1 | 11/2013 | Wang et al. |

(56) References Cited

U.S. PATENT DOCUMENTS

| | | |
|---|---|---|
| 2014/0143639 A1 | 5/2014 | Loghin et al. |
| 2014/0161154 A1 | 6/2014 | Hadani et al. |
| 2014/0169385 A1 | 6/2014 | Hadani et al. |
| 2014/0169406 A1 | 6/2014 | Hadani et al. |
| 2014/0169433 A1 | 6/2014 | Hadani et al. |
| 2014/0169436 A1 | 6/2014 | Hadani et al. |
| 2014/0169437 A1 | 6/2014 | Hadani et al. |
| 2014/0169441 A1 | 6/2014 | Hadani et al. |
| 2014/0247803 A1 | 9/2014 | Arambepola et al. |
| 2014/0348252 A1 | 11/2014 | Siohan et al. |
| 2014/0364128 A1 | 12/2014 | Lee et al. |
| 2015/0117395 A1 | 4/2015 | Hadani et al. |
| 2015/0326273 A1 | 11/2015 | Rakib et al. |
| 2015/0327085 A1 | 11/2015 | Hadani et al. |
| 2015/0382231 A1 | 12/2015 | Jabbar et al. |
| 2016/0043835 A1 | 2/2016 | Hadani et al. |
| 2016/0135132 A1 | 5/2016 | Donepudi et al. |
| 2016/0182269 A1 | 6/2016 | Hadani et al. |
| 2016/0191217 A1 | 6/2016 | Hadani et al. |
| 2016/0191280 A1 | 6/2016 | Hadani et al. |
| 2016/0254889 A1 | 9/2016 | Shattil |
| 2016/0277225 A1 | 9/2016 | Frenne et al. |
| 2016/0309345 A1 | 10/2016 | Tehrani et al. |
| 2016/0380743 A1 | 12/2016 | Rakib |
| 2016/0381576 A1 | 12/2016 | Hadani et al. |
| 2017/0012749 A1 | 1/2017 | Rakib et al. |
| 2017/0012810 A1 | 1/2017 | Rakib et al. |
| 2017/0019297 A1 | 1/2017 | Rakib |
| 2017/0033899 A1 | 2/2017 | Rakib et al. |
| 2017/0040711 A1 | 2/2017 | Rakib et al. |
| 2017/0078054 A1 | 3/2017 | Hadani et al. |
| 2017/0099122 A1 | 4/2017 | Hadani et al. |
| 2017/0099607 A1 | 4/2017 | Hadani et al. |
| 2017/0149594 A1 | 5/2017 | Rakib et al. |
| 2017/0149595 A1 | 5/2017 | Rakib et al. |
| 2017/0201354 A1 | 7/2017 | Hadani et al. |
| 2017/0207817 A1 | 7/2017 | Hadani et al. |
| 2017/0222700 A1 | 8/2017 | Hadani et al. |
| 2017/0230215 A1 | 8/2017 | Rakib et al. |
| 2017/0244524 A1 | 8/2017 | Hadani et al. |
| 2018/0077540 A1* | 3/2018 | Choi .................. H04L 27/38 |

FOREIGN PATENT DOCUMENTS

| | | |
|---|---|---|
| CN | 101939935 A | 1/2011 |
| EP | 1432168 A1 | 6/2004 |
| JP | 2011127910 A | 6/2011 |
| WO | 2007004297 | 1/2007 |
| WO | 2011137699 A1 | 11/2011 |
| WO | 2011150315 | 12/2011 |
| WO | 2013148546 | 10/2013 |
| WO | 2014004585 | 1/2014 |
| WO | 2016014596 | 1/2016 |
| WO | 2016014598 | 1/2016 |
| WO | 2016176642 | 11/2016 |
| WO | 2016183230 | 11/2016 |
| WO | 2016183240 | 11/2016 |
| WO | 2016209848 | 12/2016 |
| WO | 2017003952 | 1/2017 |
| WO | 2017011478 | 1/2017 |

OTHER PUBLICATIONS

Notice of Allowance for U.S. Appl. No. 13/117,119, dated Feb. 28, 2014, 13 pages.

Banelli, P. et al., "Modulation Formats and Waveforms for 5G Networks: Who Will Be the Heir of OFDM?," IEEE Signal Processing Magazine, vol. 81, pp. 80-93, Nov. 2014.

El Hattachi, R. et al., "NGMN 5G Initiative White Paper," NGMN Alliance, Feb. 17, 2015. [Online]. Available: https://www.ngmn.org/uploads/media/NGMN_5G_White_Paper_V1_0.pdf, 125 pages.

Rusek, F. et al., "Scaling Up MIMO, Opportunities and Challenges with Very Large Arrays," IEEE Signal Processing Magazine, pp. 40-60 (2013).

Vodafone, "Cellular Internet of Things: Architectural Aspects," RP-150869, 3GPP RAN#68, Malmo, Sweden (Jun. 9, 2015), 19 pages.

Supplementary European Search Report for European Application No. 11787483.4, dated Sep. 9, 2014, 6 pages.

International Search Report and Written Opinion for International Application No. PCT/US2011/038302, dated Nov. 15, 2011, 8 pages.

International Preliminary Report on Patentability for International Application No. PCT/US2011/038302, dated Dec. 4, 2012, 7 pages.

Office Action for U.S. Appl. No. 13/117,124, dated Feb. 22, 2013, 7 pages.

Notice of Allowance for U.S. Appl. No. 13/117,124, dated Aug. 8, 2013, 10 pages.

Office Action for U.S. Appl. No. 14/605,957, dated Jun. 22, 2017, 6 pages.

Supplementary European Search Report for European Application No. 13809004.8, dated Apr. 14, 2016, 8 pages.

Communication Pursuant to Article 94(3) EPC for European Application No. 13809004.8, dated Feb. 17, 2017, 5 pages.

Notice of Allowance for U.S. Appl. No. 13/927,087, dated Feb. 25, 2015, 9 pages.

Office Action for U.S. Appl. No. 13/927,087, dated Nov. 12, 2014, 14 pages.

Gurevich, S. et al. "Group Representation Design of Digital Signals and Sequences," S.W. Golomb et al. (eds.), SETA 2008, LNCS 5203, pp. 153-166, Springer-Verlag Berlin Heidelberg (2008).

International Search Report and Written Opinion for International Application No. PCT/US2013/047723, dated Oct. 29, 2013, 17 pages.

International Preliminary Report on Patentability for International Application No. PCT/US2013/047723, dated Dec. 31, 2014, 15 pages.

Notice of Allowance for U.S. Appl. No. 13/927,088, dated Feb. 18, 2015, 7 pages.

Office Action for U.S. Appl. No. 13/927,088, dated Nov. 28, 2014, 13 pages.

Notice of Allowance for U.S. Appl. No. 13/927,086, dated Dec. 26, 2014, 8 pages.

Supplemental Notice of Allowability for U.S. Appl. No. 13/927,086, dated Mar. 19, 2015, 4 pages.

Office Action for U.S. Appl. No. 13/927,086, dated Oct. 14, 2014, 10 pages.

Office Action for U.S. Appl. No. 13/927,089, dated Dec. 24, 2014, 13 pages.

Office Action for U.S. Appl. No. 13/927,089, dated Aug. 14, 2015, 7 pages.

Supplemental Notice of Allowability for U.S. Appl. No. 13/927,091, dated Jun. 11, 2015, 4 pages.

Notice of Allowance for U.S. Appl. No. 13/927,091, dated Apr. 24, 2015, 8 pages.

Office Action for U.S. Appl. No. 13/927,091, dated Jan. 27, 2015, 15 pages.

Office Action for U.S. Appl. No. 13/927,092, dated Oct. 8, 2014, 5 pages.

Notice of Allowance for U.S. Appl. No. 13/927,092, dated Oct. 24, 2014, 7 pages.

Office Action for U.S. Appl. No. 13/927,095, dated Apr. 30, 2015, 11 pages.

Office Action for U.S. Appl. No. 13/927,095, dated Nov. 4, 2015, 9 pages.

Office Action for U.S. Appl. No. 13/927,095, dated Jun. 1, 2016, 10 pages.

Office Action for U.S. Appl. No. 14/717,886, dated Apr. 19, 2016, 10 pages.

Office Action for U.S. Appl. No. 14/709,377, dated Dec. 11, 2015, 12 pages.

Office Action for U.S. Appl. No. 14/709,377, dated Jul. 13, 2016, 17 pages.

Examination Report No. 1 for Australian Application No. 2013239970, dated Dec. 8, 2015, 3 pages.

(56) References Cited

OTHER PUBLICATIONS

"AT&T Annual Report 2014," Opening Our Network [Online]. Retrieved from the Internet Sep. 22, 2016. <URL: http://www.att.com/Investor/ATT_Annual/2014/att_introduces_new_concepts_for_telecom_network.html>, 5 pages.
CATT, "UL ACK/NACK transmission methods for LTE-A," 3GPP TSG RAN WG1 Meeting #60bis, R1-102453, Beijing, China, Apr. 12-16, 2010, 8 pages.
Toskala, A. et al., "Physical Layer," Chapter 5 In: "LTE for UMTS: OFDMA and SC-FDMA Based Radio Access," Holma, H. et al. (eds.), John Wiley & Sons, Ltd., United Kingdom, 2009, pp. 83-135.
Mecklenbrauker, W., "A Tutorial on Non-Parametric Bilinear Time-Frequency Signal Representations," In: Time and Frequency Representation of Signals and Systems, Longo, G. et al. (eds.), Springer-Verlag Wien, vol. 309, pp. 11-68 (1989).
Nehorai, A. et al., "MURI: Adaptive waveform design for full spectral dominance (2005-2010)," AFOSR FA9550-05-1-0443, Final Report, [online], Mar. 11, 2011 Retrieved on May 11, 2013, Retrieved from the Internet <URL: http://oai.dtic.mil/oai/oai?verb=getRecord&metadataPrefix=html&identifier=ADA565420>, 103 pages.
Office Action for Japanese Application No. 2015-518647, dated Jul. 7, 2015, 10 pages.
Office Action for U.S. Appl. No. 14/754,596, dated Apr. 19, 2016, 18 pages.
Office Action for U.S. Appl. No. 14/809,129, dated Jul. 19, 2016, 5 pages.
Office Action for U.S. Appl. No. 15/617,962, dated Sep. 6, 2017, 10 pages.
International Search Report and Written Opinion for International Application No. PCT/US2016/050825, dated Feb. 8, 2017, 12 pages.
International Search Report and Written Opinion for International Application No. PCT/US2016/052524, dated Dec. 20, 2016, 8 pages.
Office Action for U.S. Appl. No. 15/374,995, dated Aug. 7, 2017, 6 pages.
International Search Report and Written Opinion for International Application No. PCT/US2017/025797, dated Jun. 21, 2017, 6 pages.
International Search Report and Written Opinion for International Application No. PCT/US2016/030259, dated Aug. 4, 2016, 13 pages.
Office Action for U.S. Appl. No. 15/152,464, dated Apr. 6, 2017, 10 pages.
Examination Report No. 1 for Australian Application No. 2013280487, dated May 2, 2016, 3 pages.
International Search Report and Written Opinion for International Application No. PCT/US2016/031928, dated Oct. 7, 2016, 10 pages.
Office Action for U.S. Appl. No. 15/188,946, dated May 8, 2017, 14 pages.
International Search Report and Written Opinion for International Application No. PCT/US2016/038584, dated Sep. 26, 2016, 8 pages.
Office Action for U.S. Appl. No. 15/187,668, dated Feb. 16, 2017, 6 pages.
International Search Report and Written Opinion for International Application No. PCT/US2016/031909, dated Aug. 11, 2016, 13 pages.
Office Action for U.S. Appl. No. 15/194,494, dated May 5, 2017, 16 pages.
International Search Report and Written Opinion for International Application No. PCT/US2016/039662, dated Nov. 29, 2016, 14 pages.
Office Action for U.S. Appl. No. 15/436,653, dated Jun. 2, 2017, 10 pages.
Office Action for U.S. Appl. No. 15/208,545, dated Aug. 21, 2017, 15 pages.
International Search Report and Written Opinion for International Application No. PCT/US2016/041940, dated Oct. 20, 2016, 8 pages.
Supplementary European Search Report for European Application No. 13768150.8, dated Oct. 30, 2015, 7 pages.
International Search Report and Written Opinion for International Application No. PCT/US2013/033652, dated Jun. 12, 2013, 8 pages.
International Search Report and Written Opinion for International Application No. PCT/US2015/041417, dated Oct. 1, 2015, 7 pages.
Office Action for U.S. Appl. No. 14/805,407, dated Dec. 14, 2016, 7 pages.
International Search Report and Written Opinion for International Application No. PCT/US2015/041420, dated Oct. 1, 2015, 6 pages.

\* cited by examiner

TRANSPORT BLOCK SEGMENTATION FOR MULTI-LEVEL CODES

CROSS-REFERENCE TO RELATED APPLICATIONS

This patent document is a 371 National Phase Application of PCT Application No. PCT/US2017/054517 entitled "TRANSPORT BLOCK SEGMENTATION FOR MULTI-LEVEL CODES" filed on Sep. 29, 2017, which claims priority to and benefit of U.S. Provisional Patent Application No. 62/401,682 entitled "TRANSPORT BLOCK SEGMENTATION FOR MULTI-LEVEL CODES" filed on Sep. 29, 2016. The entire contents of the aforementioned patent applications are incorporated by reference as part of the disclosure of this patent document.

TECHNICAL FIELD

The present document relates to wireless communication, and more particularly, transmission and reception of multi-level constellation signals.

BACKGROUND

Due to an explosive growth in the number of wireless user devices and the amount of wireless data that these devices can generate or consume, current wireless communication networks are fast running out of bandwidth to accommodate such a high growth in data traffic and provide high quality of service to users.

Various efforts are underway in the telecommunication industry to come up with next generation of wireless technologies that can keep up with the demand on performance of wireless devices and networks.

SUMMARY

This document discloses techniques for transmission and reception of signals with improved error-rate performance, using multi-level constellation symbols.

In one example aspect, a method of wireless communication in which data is transmitted in units of transport blocks is disclosed. The method includes dividing bits of the transport block into a number of code blocks, wherein each code block corresponds to a bit-level of a multi-level modulation scheme used for transmission, and wherein a size of each code block is inversely proportional to a corresponding coding rate used for coding the code block, In another example aspect, an apparatus comprising a processor and a transmitter circuit is disclosed. The apparatus includes a first circuit at which data is received for transmission over network, and a second circuit, which organizes the data into a number of code blocks. The processor processes the code blocks to generate a quadrature amplitude modulation (QAM) modulated output signal. The transmitter circuit that transmits the output signal. Sizes of code blocks are selected such that at least one code block per bit level of a multi-level encoding is used, all code blocks have sizes less than or equal to a maximum size and coded bit levels occupy a same number of QAM symbols These, and other, features are described in this document.

DESCRIPTION OF THE DRAWINGS

Drawings described herein are used to provide a further understanding and constitute a part of this application. Example embodiments and illustrations thereof are used to explain the technology rather than limiting its scope.

DETAILED DESCRIPTION

To make the purposes, technical solutions, and advantages of this disclosure more apparent, various embodiments are described in detail below with reference to the drawings. Unless otherwise noted, embodiments and features in embodiments of the present document may be combined with each other.

Section headings are used in the present document to improve readability of the description and do not in any way limit the discussion to the respective sections.

Fifth generation (5G) wireless systems are expected to provide unprecedented data rates and support a vast range of services. In this context, the 3GPP standards organization is defining the physical layer capabilities the NR (5G New Radio) system to support higher data rates. In the following, processing a basic unit of information, referred to as a transport block (TB), is described including processing coding and modulation applied to the information. The process is suitable for a family of codes that may be referred to as multi-level coding (MLC) codes, which present several important advantages for wireless systems, as described below.

It is expected that MLC codes will be used for error correction coding of data in the next generation communication systems. In some embodiments, MLC codes may be used to provide different levels of robustness, or error protection, to different bit positions in a multi-bit constellation. For example, a number of most significant bits of a multi-level QAM modulation may be protected using different error correction codes than the less significant bits. Current wireless systems, such as a long term evolution (LTE) system defined by the 3GPP consortium, do not provide MLC protection. The LTE system, however, prescribes the use of a transport block (TB) that is encoded and transmitted in a subframe of transmission.

The techniques described in the present document can be used to generate code blocks suitable for MLC at a transmitter and to modulate according to a QAM constellation the code blocks prior to transmission over the medium. Described herein are methods for data segmentation and encoding.

Figure 1:
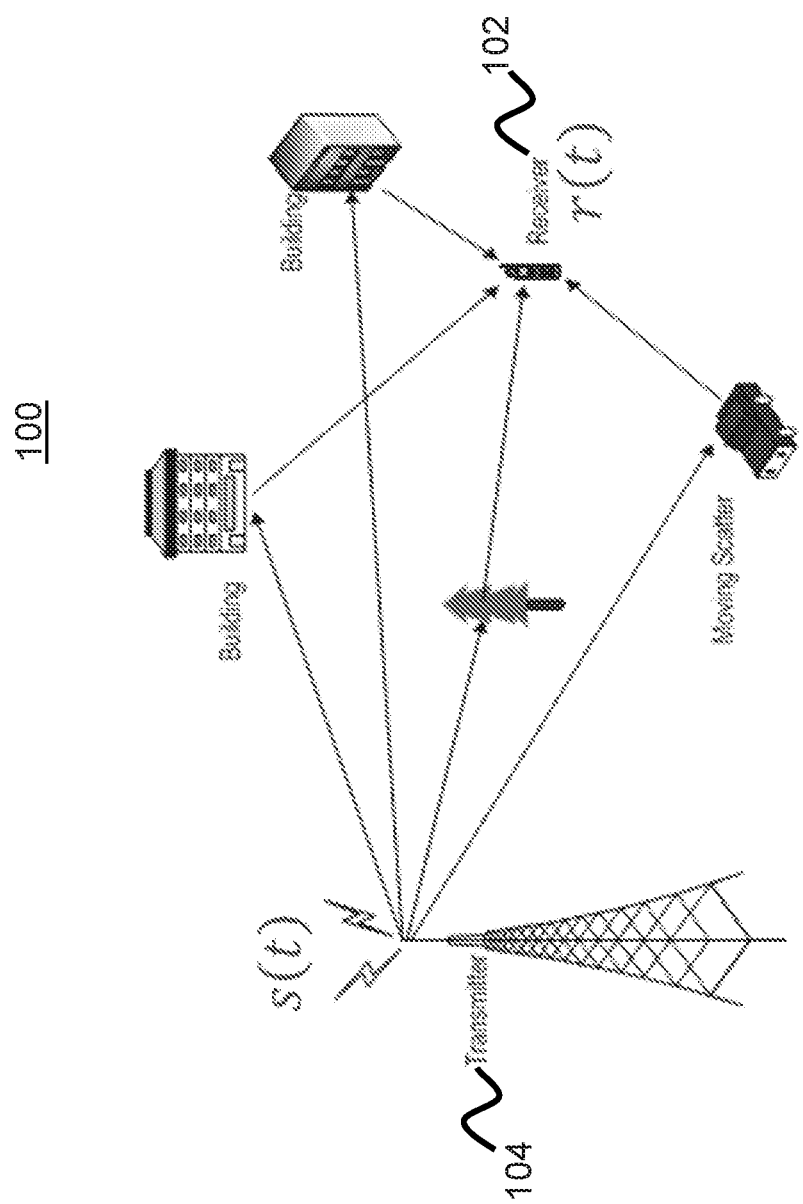
FIG. 1 depicts an example of a communication network, in accordance with some example embodiments.

FIG. 1 shows an example communication network 100 in which the disclosed technologies can be implemented. The network 100 may include a base station transmitter 104 that transmits wireless signals s(t) (downlink signals) to one or more receivers 102, the received signal being denoted as r(t), which may be located in a variety of locations, including inside or outside a building and in a moving vehicle. The receivers may transmit uplink transmissions to the base station, typically located near the wireless transmitter. The technology described herein may be implemented at a receiver 102 or at the transmitter 104 (e.g., a base station).

LTE Transport Block Segmentation Procedure

Figure 2:
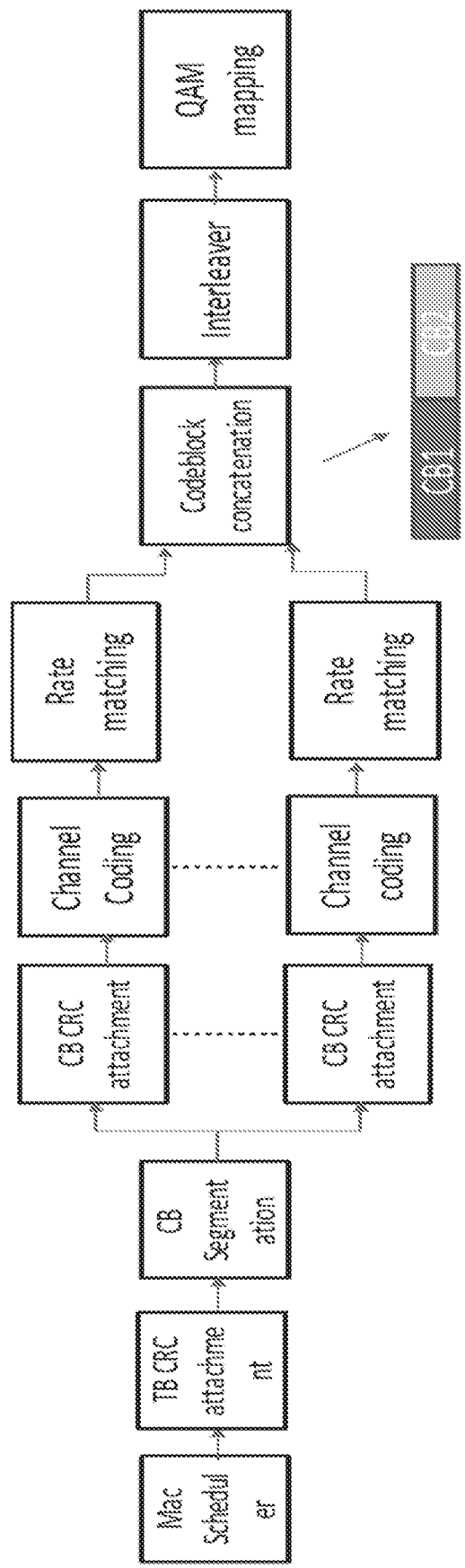
FIG. 2 depicts an example of a long-term evolution (LTE) and LTE new radio (NR) segmentation process, in accordance with some example embodiments.
Figure 3:
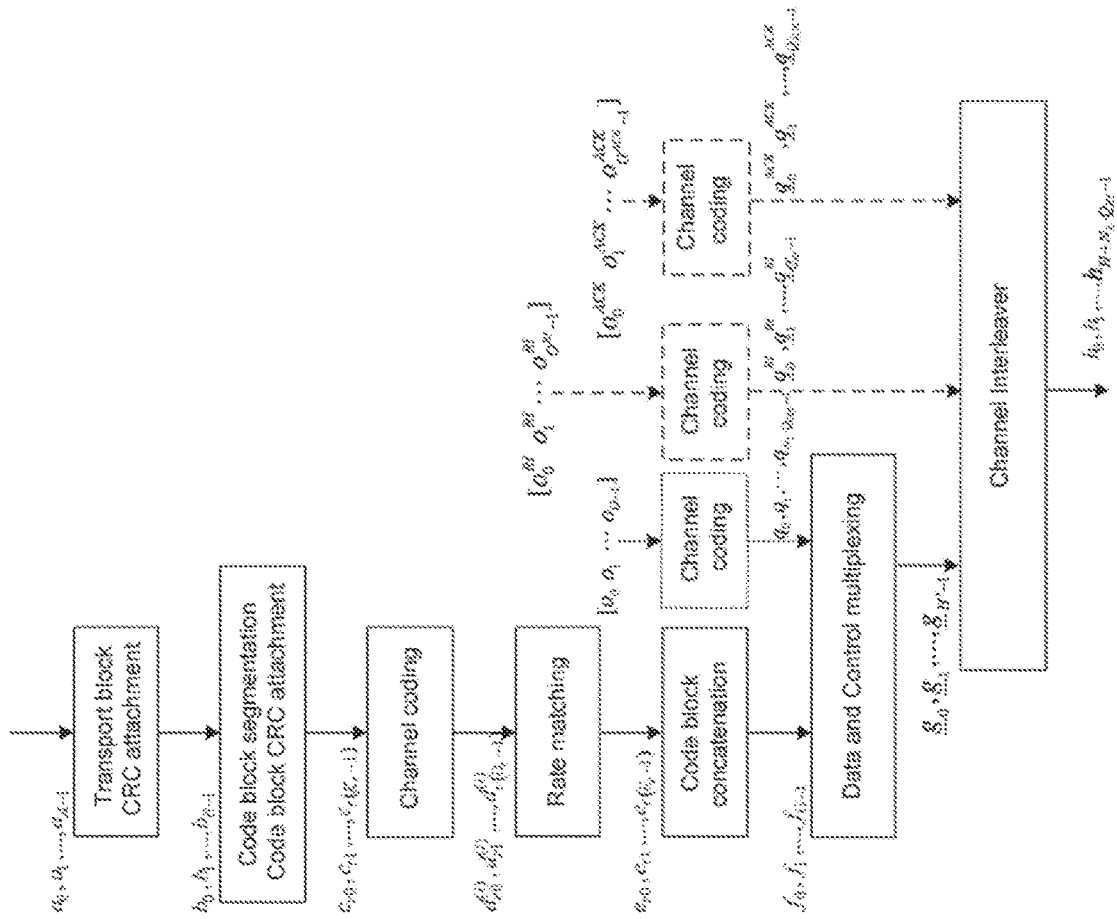
FIG. 3 depicts an example of transport block processing in LTE, in accordance with some example embodiments.

In an LTE system and other system, information is encapsulated in transport blocks (TB), which are transmitted in a given subframe. The information bits in each TB are encoded by the channel encoder prior to transmission. For large TBs, a segmentation process is defined for LTE in 3GPP TS 36.212, "LTE; Evolved Universal Terrestrial Radio Access (E-UTRA); Multiplexing and channel coding," (hereinafter "TS 36.212"). In this procedure, the TB is broken into a number of codeblocks (CB) with a given maximum size. For example, the maximum size may be L=6144 bits. A cyclic redundancy code (CRC) is appended to each CB, and an additional CRC is appended at the end of the TB. The LTE process for CB segmentation is detailed in FIG. 2. Moreover, it is a component of LTE transport block processing, detailed in TS 36.212 and shown in FIG. 3.

NR Transport Block Segmentation Procedure

NR also has a block segmentation process defined in 3GPP TS 38.212, "NR; Multiplexing and channel coding", v0.0.2 (hereinafter, TS 38.212). Information is encapsulated in transport blocks (TB), which are transmitted in a given subframe. The information bits in each TB are encoded by the channel encoder prior to transmission. For large TB, a segmentation procedure is performed. In this procedure, the TB is broken into a number of codeblocks (CB) with a given maximum size such as KCB=8448 bits. Each CB is appended a CRC. The NR procedure for CB segmentation can also be described by FIG. 2.

Multi-Level Coding

MLC codes are channel codes that include multiple encoders and/or decoders. When coupled with a quadrature amplitude modulation (QAM), MLC codes may be used to separately encode each bit level in a constellation, from the most significant bit (MSB) to the least significant bit (LSB). Each bit level may be understood to be a parallel bit channel, with each individual encoder in the MLC encoder being used for each parallel bit channel. Any channel code may be used as an individual MLC encoder. Examples include turbo codes, such as the LTE turbo code, and low density parity check (LDPC) codes, such as the NR LDPC code. For a bit level, in-phase and quadrature signals may be encoded jointly. Moreover, several bit levels may be encoded together.

Figure 4:
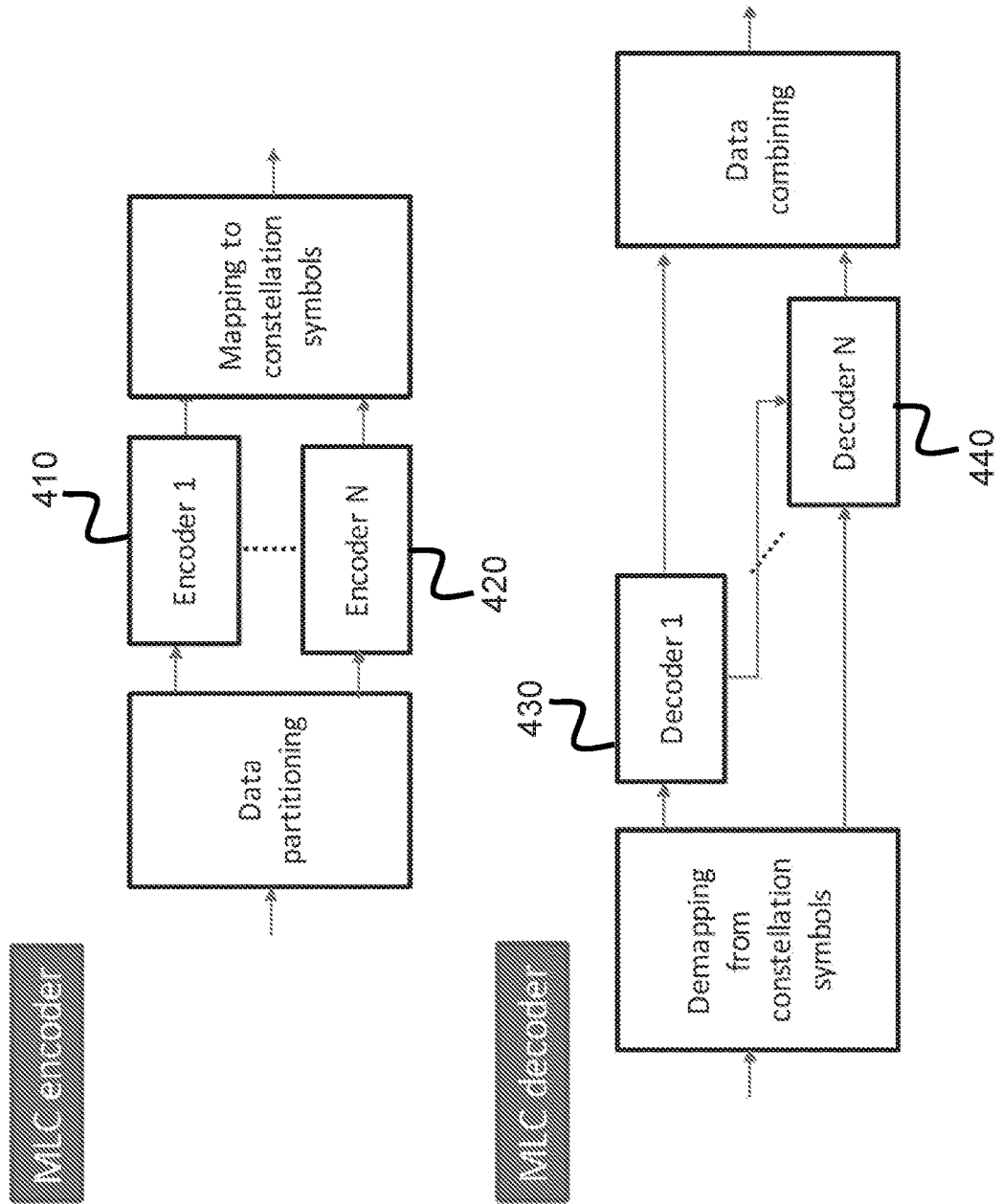
FIG. 4 depicts an example of a multilevel coding (MLC) encoder and decoder, in accordance with some example embodiments.

An example is given in FIG. 4. Encoder 1 at 410 encodes the most significant bit (MSB), encoder 2 encodes the next most significant bit (not shown in FIG. 4), and so on to encoder N at 420 encoding the least significant bit (LSB). At the receiver, decoder 1 at 430 decodes the corresponding most significant bit from encoder 1 at 410, decoder 2 decodes the corresponding next most significant bit from the next encoder, and decoder N at 440 decodes the corresponding LSB from encoder N at 420. The structure of the MLC, coupled with a QAM constellation, may be particularly appropriate for several wireless communications applications. For example, it may be used for certain types of receivers in wireless communications such as iterative receivers, because it allows information to be encoded and decoded independently.

The decoder may decode each parallel bit channel successively (referred to as successive decoding), and use information about already decoded bit channels to improve the decoder performance of ensuing decoders, as illustrated in FIG. 4. Successive decoding may take place in any order. For example, successive decoding may be used from most significant bit to least significant bit, from least significant bit to most significant bit, or in any other bit order.

Transport Block Segmentation for Multilevel Codes

In order to enable independent operation of the MLC encoders and decoders, a TB is segmented into multiple code blocks. At a minimum, the number of code blocks equals the number of MLC encoders. Since the code rates of each MLC encoder may be different, code block sizes may be different.

In addition, in order to facilitate implementation by limiting buffer sizes, a maximum code block size may be determined.

In one embodiment, suitable for LTE, LTE NR, or new generations of cellular, wireless, wired, satellite, or other communications systems, where M-QAM is used, and for a TB of size B bits, the following process may be is used:

1. Define the number of code blocks as $C=\frac{1}{2} \log_2 M$, where M is the order of the QAM constellation. Each bit level is encoded separately, and for a given bit level, in-phase and quadrature bits are encoded together, with the bits in the equivalent bit level in each dimension belonging to the same code block. The size of each code block $K_c$, $c=1, \ldots, C$ is determined in relation to the coding rate at each bit level, and satisfies:

$$2\left\lceil\frac{K_1 + L}{2R_1}\right\rceil = 2\left\lceil\frac{K_2 + L}{2R_2}\right\rceil = \ldots = 2\left\lceil\frac{K_C + L}{2R_C}\right\rceil \quad \text{Equation 1}$$

$$\sum_{c=1}^{C} K_c = B \quad \text{Equation 2}$$

where $K_c$, $c=1, \ldots, C$ is the code rate of each encoder, and L is the size of an error detection field, such as CRC. In the absence of such field, L=0. With this process, the sizes of the code blocks at each bit level are such that the same number of QAM symbols per bit level are used.

The equations above need not be satisfied in a strict sense. After the necessary code block sizes, $K_c$, $c=1, \ldots C$, have been determined, this embodiment also includes utilizing smaller block sizes and inserting filler bits until the sizes $K_c$, $c=1, \ldots C$, are fulfilled. Filler bits have the function of adjusting the block size but do not carry information.

If for each code block $K_c+L \leq Z$, where Z is the maximum code block size, then $C=\frac{1}{2} \log_2 M$ and the process ends. The number of bits corresponding to the TB is $B'=B+L*C$. In addition to the CRC field appended to each code block, a CRC field for the entire TB may also be appended.

2. If, for some bit level c, $K_c+L>Z$, then further divide the code block into the smallest number $n_c$ satisfying $$\left\lceil\frac{K_c}{n_c} + L\right\rceil \leq Z,$$

and define the size of the code blocks in bit level c as $K_{c,i}$, $i=1, \ldots, n_c \cdot K_{c,i}$ should be defined so as not to exceed Z.

3. Resize code blocks such that:

$$2\left\lceil \frac{\sum_{i=1}^{n_1} \left\lceil \frac{K_{1,i}+L}{R_1} \right\rceil}{2} \right\rceil = 2\left\lceil \frac{\sum_{i=1}^{n_2} \left\lceil \frac{K_{2,i}+L}{R_2} \right\rceil}{2} \right\rceil = \ldots = 2\left\lceil \frac{\sum_{i=1}^{n_C} \left\lceil \frac{K_{C,i}+L}{R_C} \right\rceil}{2} \right\rceil$$

Equation 3 i.e. bit levels occupy the same number of QAM symbols, and then repeat step 2 above if necessary, until code block sizes do not exceed Z. Alternatively, one CRC per bit level may be used, in which case there is no need to resize code blocks.

At the end of the code block segmentation process, code block sizes are such that at least one code block per bit level is used, the code blocks satisfy the maximum length constraint, and the coded bit levels occupy the same number of QAM symbols.

If the equalities above (Equations 1-3) cannot be satisfied, the TB size B may be increased with filler bits so that the equalities above may be satisfied. For example, filler bits may include one or more dummy "1s" or "0s" to increase the size of B.

In one embodiment, Z=6144 bits, the current maximum code block size for the LTE standard.

In another embodiment, Z=8448 bits, the maximum block size specified for the 3GPP NR standard TS 38.212. Other values that facilitate hardware implementation may be adopted.

In another embodiment, the procedure described in TS 36.212 may be applied to determine the code block sizes in the second step of the above process.

In another embodiment, in-phase and quadrature bits may be contained in separate code blocks, such as that the total number of blocks is at least $\log_2 M$.

In some example embodiments, codes may be LDPC codes, such as the 3GPP NR LDPC code, turbo codes, polar codes, convolutional and tail-biting convolutional codes, or any other type of forward error correcting code.

In order to achieve all code rates required in the multi-level code, a single code followed by puncturing may be used, or different codes with different code rates may be used.

Repetition coding may be used to further reduce the code rate of the codes.

In other embodiments, the foregoing process may be used for other types of modulations, such as M-PSK, hierarchical QAM constellations, M-ASK, irregular constellations, and, in general, any constellation containing more than one bit per symbol.

As part of the transmitter processing, bit interleaving can be included prior to mapping to constellation symbols. In order to allow independent decoding, interleaving may be restricted to each bit level. This does not preclude interleaving multiple code blocks in a given bit level.

At the receiver, a code block aggregation procedure may be performed, which includes removing the CRC field of each code block and concatenating the code blocks to recover the original TB.

Figure 5:
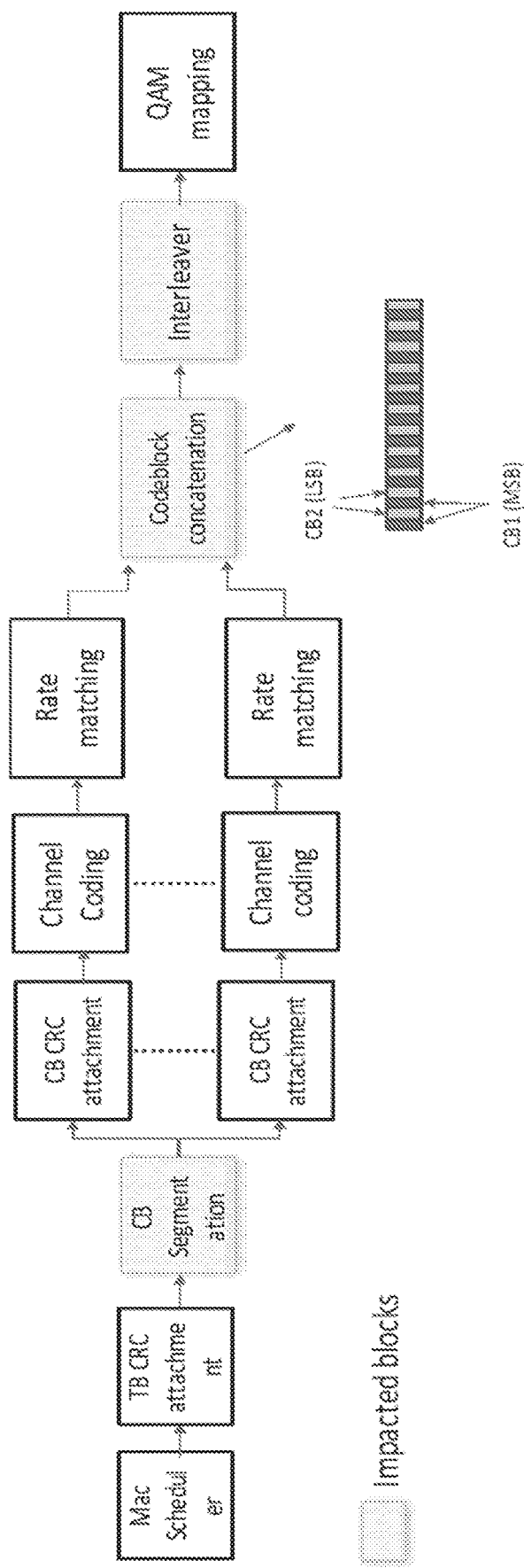
FIG. 5 depicts an example of a process for transport block segmentation for MLC codes, in accordance with some example embodiments.

The segmentation procedure described above may be inserted in the MLC transmitter as shown in FIG. 5. The corresponding aggregation procedure described above may be inserted in the MLC receiver.

Figure 6:
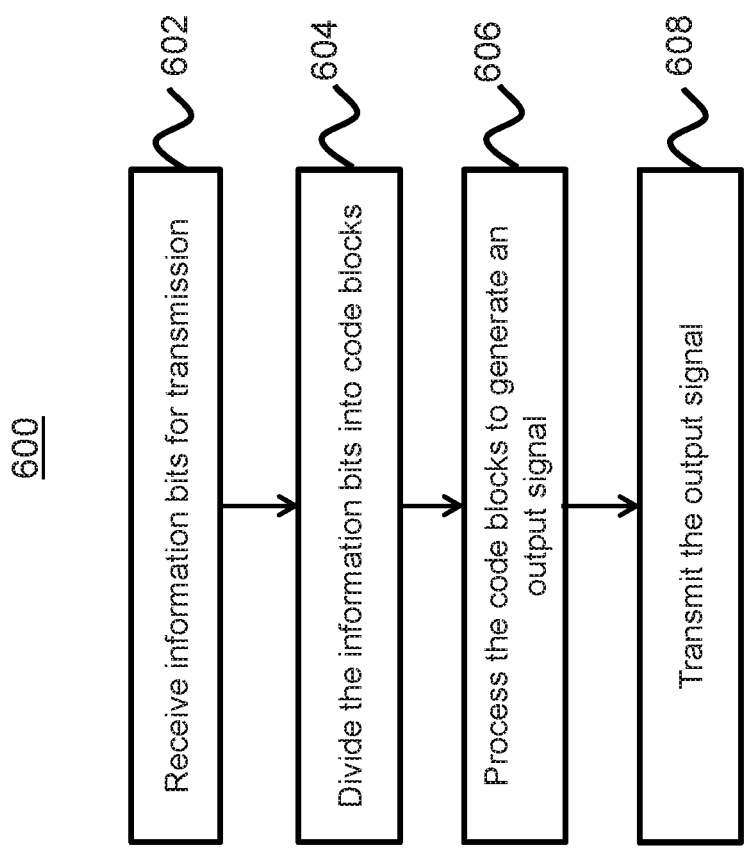
FIG. 6 depicts another process, in accordance with some example embodiments.

FIG. 6 depicts a process for data transmission, in accordance with some example embodiments.

The method 600 includes, at 602, receiving information bits for transmission. The information bits may include user data and/or control data. The information bits may be locally generated at the transmitter apparatus implementing the method 600 and may represent application-level data or audio signal. In some embodiments, the information bits may be received at a peripheral interface (e.g., USB, Lightening, or HDMI interface) for transmission over the network.

The method 600 includes, at 604, dividing bits of the transport block into a number of code blocks. As described above, each code block may correspond to a bit-level of a multi-level modulation scheme used for transmission. The sizes may be selected so that sizes of each code block is inversely proportional to a corresponding coding rate used for coding the code block and the equality shown in Equations 1-3 may be satisfied.

The method 600 includes, at 606, processing the code blocks to generate an output signal. The processing operation may include concatenating the code blocks to generate a concatenated code block sequence, interleaving the concatenated sequence to generate a concatenated code block sequence, and mapping the concatenated code block sequence to a QAM constellation.

The method 600 includes, at 608, transmitting the output signal.

In some embodiments, a wireless communication apparatus includes a first circuit at which data is received for transmission over network, a second circuit, which organizes the data into a number of code blocks, a processor that processes the code blocks to generate a Quadrature Amplitude Modulation (QAM) modulated output signal, and a transmitter circuit that transmits the output signal. Sizes of code blocks are selected such that at least one code block per bit level of a multi-level encoding is used, all code blocks have sizes less than or equal to a maximum size and coded bit levels occupy a same number of QAM symbols.

Figure 7:
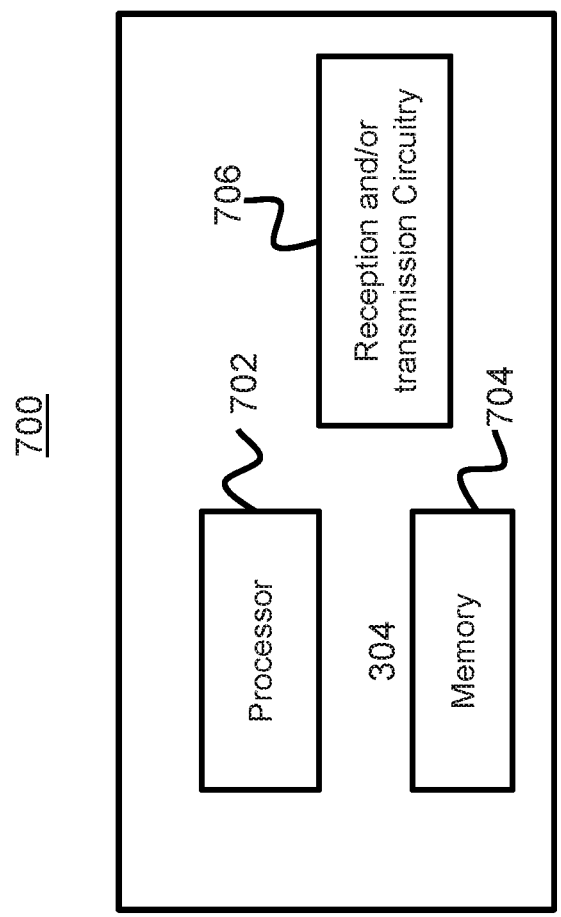
FIG. 7 depicts an example of a wireless transceiver apparatus, in accordance with some example embodiments.

FIG. 7 shows an example of a wireless transceiver apparatus 700. The apparatus 700 may be used to implement method 600 and/or the process described above. The apparatus 700 includes a processor 702, a memory 704 that stores processor-executable instructions and data during computations performed by the processor. The apparatus 700 includes reception and/or transmission circuitry 706, e.g., including radio frequency operations for receiving or transmitting signal and/or receiving data or information bits for transmission over a wireless network.

It will be appreciated that the disclosed techniques can be used to improve transmission and allocate bits to code blocks in a multi-level encoding based transmission scheme. Unless otherwise noted, various terms used herein are consistent with the usage in 3GPP TS 36.212, "LTE; Evolved Universal Terrestrial Radio Access (E-UTRA); Multiplexing and channel coding" document version 14.0.0, dated September 2016, and/or 3GPP TS 38.212, "NR; Multiplexing and channel coding", v0.0.2, dated August 2017, both of which are incorporated by reference in their entirety herein.

The disclosed and other embodiments, modules and the functional operations described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this patent document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A wireless communication method of wireless communication in which data is transmitted in units of transport blocks, comprising:
   dividing bits of a transport block into a plurality of code blocks, wherein each code block of the plurality of code blocks corresponds to a bit-level of a multi-level modulation scheme used for transmission, and wherein a size of each code block is inversely proportional to a corresponding coding rate used for coding the code block;
   processing the plurality of code blocks to generate an output signal; and
   transmitting the output signal.

2. The method of claim 1, wherein processing the plurality of code blocks includes:
   resizing, based on a maximum size of a code block of the plurality of code blocks, each code block to generate a plurality of resized code blocks; and
   generating the output signal using the plurality of resized code blocks.

3. The method of claim 2, wherein the resizing operation includes:
   further dividing each code block into a smaller size that is less than the maximum size to generate the plurality of resized code blocks.

4. The method of claim 2, wherein the maximum size is equal to 6144 bits.

5. The method of claim 2, wherein the maximum size is equal to 8448 bits.

6. The method of claim 1, wherein the multi-level modulation scheme includes an M-level amplitude modulation scheme, and wherein a number of the plurality of code blocks, C, is $C=\frac{1}{2}\log_2 M$.

7. The method of claim 6, wherein the size of each code block satisfies a condition:

$$2\left\lceil \frac{K_1+L}{2R_1} \right\rceil = 2\left\lceil \frac{K_2+L}{2R_2} \right\rceil = \ldots = 2\left\lceil \frac{K_C+L}{2R_C} \right\rceil$$

wherein $K_i$ represents a size of $i^{th}$ code block, L represents a size of a cyclic redundancy code and $R_i$ represents a corresponding code rate used for processing the $i^{th}$ code block.

8. The method of claim 1, wherein the operation of dividing bits of the transport block includes stuffing filler bits such that a same number of symbols are used for each bit level.

9. The method of claim 1, wherein the processing the plurality of code blocks to generate the output signal includes performing in-phase and quadrature modulation on the plurality of code blocks.

10. The method of claim 1, wherein the operation of processing the plurality of code blocks to generate the output signal includes:
concatenating the plurality of code blocks to generate a concatenated code block sequence; and
interleaving the concatenated code block sequence to generate an interleaved concatenated code block sequence, wherein the interleaving is performed at each bit level; and
mapping the interleaved concatenated code block sequence to a QAM constellation.

11. A wireless data transmission apparatus, comprising
a first circuit at which data is received for transmission over a network;
a second circuit which organizes the data into a plurality of code blocks;
a processor that processes the plurality of code blocks to generate a quadrature amplitude modulation (QAM)-modulated output signal; and
a transmitter circuit that transmits the QAM-modulated output signal,
wherein sizes of the plurality of code blocks are selected such that at least one code block per bit level of a multi-level encoding is used, wherein each of the plurality of code blocks has a size less than or equal to a maximum size, wherein a size of each code block is inversely proportional to a corresponding coding rate used for coding the code block, and wherein coded bit levels occupy a same number of QAM symbols.

12. The apparatus of claim 11, the processing the plurality of code blocks includes:
resizing, selectively based on a maximum size of a code block of the plurality of code blocks, the each code block to generate a plurality of resized code blocks; and
using the plurality of resized code blocks to generate the output signal.

13. The apparatus of claim 12, wherein the resizing operation includes:
further dividing each code block into a smaller size that is less than the maximum size to generate the plurality of resized code blocks.

14. The apparatus of claim 12, wherein the maximum size is equal to 6144 bits.

15. The apparatus of claim 12, wherein the maximum size is equal to 8448 bits.

16. The apparatus of claim 11, wherein the plurality of code blocks corresponds to a multi-level modulation scheme that includes an M-level quadrature amplitude modulation scheme, and wherein a number of the plurality of code blocks, C, is equal to $C = \frac{1}{2} \log_2 M$.

17. The apparatus of claim 16, wherein the size of each code block satisfies a condition:

$$2\left\lceil \frac{K_1 + L}{2R_1} \right\rceil = 2\left\lceil \frac{K_2 + L}{2R_2} \right\rceil = \ldots = 2\left\lceil \frac{K_C + L}{2R_C} \right\rceil$$

where $K_i$ represents a size of $i^{th}$ code block, L represents a size of a cyclic redundancy code and $R_i$ represents a corresponding code rate used for processing the $i^{th}$ code block.

18. The apparatus of claim 11, wherein the operation of organizing the data includes stuffing filler bits such that a same number of symbols are used for each bit level.

19. The apparatus of claim 11, wherein the processing the plurality of code blocks to generate the output signal includes performing in-phase and quadrature modulation on the plurality of code blocks.

20. The apparatus of claim 11, wherein the operation of processing the plurality of code blocks to generate the output signal includes:
concatenating the plurality of code blocks to generate a concatenated code block sequence; and
interleaving the concatenated code block sequence to generate an interleaved concatenated code block sequence, wherein the interleaving is performed at each bit level; and
mapping the interleaved concatenated code block sequence to a QAM constellation.

\* \* \* \* \*